(12) United States Patent
Zhao et al.

(10) Patent No.: US 12,759,866 B2
(45) Date of Patent: Oct. 13, 2026

US012759866B2

(54) MEMS MICROPHONE

(71) Applicant: AAC ACOUSTIC TECHNOLOGIES (SHENZHEN) CO., LTD., Shenzhen (CN)

(72) Inventors: Zhuanzhuan Zhao, Shenzhen (CN); Kaijie Wang, Shenzhen (CN); Rui Zhang, Shenzhen (CN)

(73) Assignee: AAC ACOUSTIC TECHNOLOGIES (SHENZHEN) CO., LTD., Shenzhen (CN)

( * ) Notice: Subject to any disclaimer, the term of this patent is extended or adjusted under 35 U.S.C. 154(b) by 456 days.

(21) Appl. No.: 18/454,038

(22) Filed: Aug. 22, 2023

(65) Prior Publication Data

US 2024/0217809 A1 Jul. 4, 2024

Related U.S. Application Data

(63) Continuation of application No. PCT/CN2023/084822, filed on Mar. 29, 2023.

(30) Foreign Application Priority Data

Dec. 29, 2022 (CN) ........................ 202223606035.9

(51) Int. Cl.
*B81B 3/00* (2006.01)

(52) U.S. Cl.
CPC .... *B81B 3/0056* (2013.01); *B81B 2201/0257* (2013.01); *B81B 2203/0127* (2013.01); *B81B 2203/0315* (2013.01); *B81B 2203/0353* (2013.01)

(58) Field of Classification Search
CPC .......... B81B 3/0056; B81B 2201/0257; B81B 2203/0127; B81B 2203/0315; B81B 2203/0353; H04R 19/04; H04R 19/01; H04R 19/005
See application file for complete search history.

(56) References Cited

U.S. PATENT DOCUMENTS

| | | | | |
|---|---|---|---|---|
| 2008/0019543 A1* | 1/2008 | Suzuki | H04R 31/00 | 381/174 |
| 2012/0319217 A1* | 12/2012 | Dehe | B81C 1/00182 | 438/488 |
| 2015/0189444 A1* | 7/2015 | Pan | H04R 19/005 | 381/173 |
| 2017/0203961 A1* | 7/2017 | Chang | H04R 7/14 | |

FOREIGN PATENT DOCUMENTS

| | | | |
|---|---|---|---|
| CN | 102740204 A | * 10/2012 | |
| CN | 111757228 A | * 10/2020 | H04R 19/04 |

* cited by examiner

*Primary Examiner* — Moazzam Hossain
(74) *Attorney, Agent, or Firm* — Wiersch Law Group

(57) ABSTRACT

A MEMS microphone, includes a substrate with a back cavity, and a capacitive system including a back plate and a diaphragm located on the substrate, the back plate includes a body portion and a first protrusion, the diaphragm includes a main portion and a second protrusion, the first protrusion is corresponding to the second protrusion, the substrate includes an upper end close to the capacitive system and a lower end away from the capacitive system, an opening of the back cavity at the upper end of the substrate is larger than an opening at the lower end of the substrate. Compared with the related art, the MEMS microphone disclosed by the present disclosure could improve the resonant frequency.

9 Claims, 1 Drawing Sheet

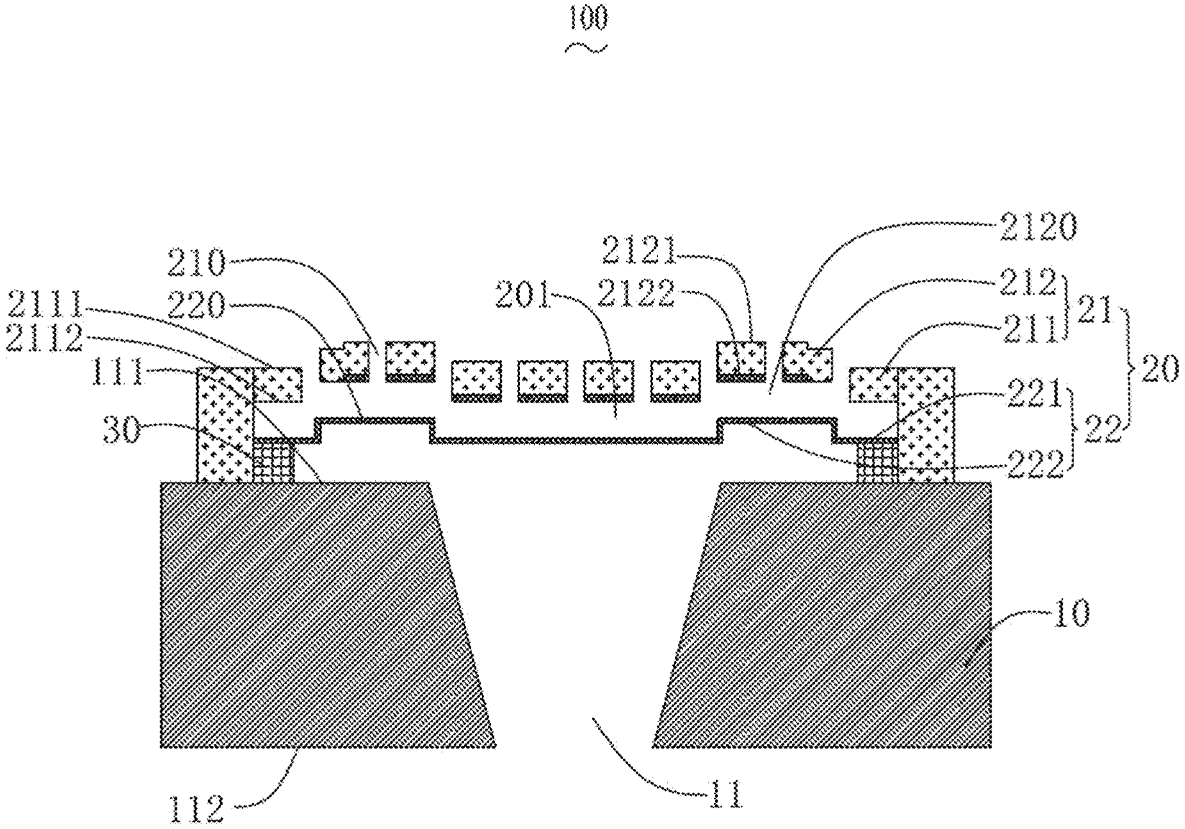
100
2120
2121
210
212
2111
220
201
2122
21
2112
211
20
111
221
30
22
222
10
112
11

MEMS MICROPHONE

TECHNICAL FIELD

The present disclosure relates to a field of sound-electric conversion technology, in particular to a micro-electro-mechanical system (MEMS) microphone.

BACKGROUND

With rapid development of the mobile communication technology in recent years, mobile communication devices such as portable phones, portable phones capable of accessing Internet, personal digital assistants and other devices that perform communication specially utilizing communication networks are used more and more. A microphone, especially a MEMS microphone, is one of the most important units used in the above-described devices.

A micro-electro-mechanical system (MEMS) microphone is an electroacoustic transducer produced by micro-mechanical technology, with small volume, excellent frequency response characteristic, low noise and the like. As electronic devices are getting miniaturized, lightened and thinned, MEMS microphones are increasingly widely used in those devices.

The MEMS microphone in the related art includes a substrate with a back cavity and a capacitive system arranged on the substrate, the capacitive system includes a back plate and a diaphragm arranged opposite to the back plate. Increasing the diaphragm stiffness increases the resonant frequency of the MEMS microphone, but at the same time decreases the sensitivity of the MEMS microphone, thus decreasing the signal-to-noise ratio. Thus, it is necessary to provide a MEMS microphone to solve the problem.

SUMMARY

In view of the above, an objective of the present disclosure is to provide a MEMS microphone with high resonant frequency.

In order to achieve the objective mentioned above, the present disclosure discloses a MEMS microphone, including: a substrate with a back cavity, and a capacitive system located on the substrate, comprising a back plate and a diaphragm opposite to the back plate, a gap formed between the back plate and the diaphragm, wherein the back plate comprises a body portion and a first protrusion extending from the body portion in a direction away from the substrate, the diaphragm comprises a main portion and a second protrusion extending from the main portion in the direction away from the substrate, the first protrusion is corresponding to the second protrusion, the substrate comprises an upper end close to the capacitive system and a lower end away from the capacitive system, an opening of the back cavity at the upper end of the substrate is larger than an opening at the lower end of the substrate.

As an improvement, the diaphragm is located at a side of the back plate close to the substrate.

As an improvement, the first protrusion and the second protrusion are annular structures.

As an improvement, the back plate is provided with a plurality of through holes communicating with the outside and the gap, the through holes penetrate through the first protrusion.

As an improvement, the diaphragm is provided with a slit penetrating through the second protrusion, the gap communicates with the back cavity through the slit.

As an improvement, an aperture diameter of the back cavity becomes progressively larger in a direction from the upper end of the substrate to the lower end of the substrate.

As an improvement, a projection of the second protrusion along the vibration direction of the diaphragm is located in the substrate totally.

As an improvement, a sacrificial layer is provided between the diaphragm and the substrate, the sacrificial layer is connected with an outer edge of the diaphragm and the substrate.

BRIEF DESCRIPTION OF DRAWINGS

FIG. 1 is a cross-sectional view of the MEMS microphone in accordance with an exemplary embodiment of the present disclosure.

DESCRIPTION OF EMBODIMENTS

The technical solutions in embodiments of the present disclosure will be described clearly and completely below with reference to the accompanying drawings in the embodiments of the present disclosure.

As shown in FIG. 1, the present disclosure discloses a MEMS microphone 100 including a substrate 10 with a back cavity 11 and a capacitive system 20 arranged on the substrate 10. The capacitive system 20 includes a back plate 21 and a diaphragm 22 opposite to the back plate 21, a gap 201 is formed between the back plate 21 and the diaphragm 22. When the sound pressure acts on the diaphragm 22, there is a pressure difference between the two sides of the diaphragm 22 facing the back plate 21 and the diaphragm 22 away from the back plate 21, so that the diaphragm 22 moves closer to the back plate 21 or away from the back plate 21, thereby causing the diaphragm 22 to move, the change of the capacitance with the back plate 21 realizes the conversion of the sound signal to the electrical signal. The diaphragm 22 is located on a side of the back plate 21 close to the substrate 10, in the other embodiment, the diaphragm could also be located on a side of the back plate far away from the substrate.

The substrate 10 includes an upper end 111 close to the capacitive system 20 and a lower end 112 away from the capacitive system 20, an opening of the back cavity 11 at the upper end 111 of the substrate 10 is larger than an opening at the lower end 112 of the substrate 10. In addition, an aperture diameter of the back cavity 11 becomes progressively larger in a direction from the upper end 111 of the substrate 10 to the lower end 112 of the substrate 10, therefore, by reducing the size of the back cavity 11, the resonant frequency of the MEMS microphone 100 can also be increased.

The back plate 21 includes a body portion 211 and a first protrusion 212 extending from the body portion 211 in a direction away from the substrate 10, the diaphragm 22 includes a main portion 221 and a second protrusion 222 extending from the main portion 221 in the direction away from the substrate 10, the first protrusion 212 includes a first upper surface 2121 away from the substrate 10 and a first lower surface 2122 close to the substrate 10, the body portion 211 includes a second upper surface 2111 away from the substrate 10 and a second lower surface 2112 close to the substrate 10, the first upper surface 2121 of the first protrusion 212 is disposed further from the substrate 10 than the second upper surface 2111 of the body portion 211, and the first lower surface 2122 of the first protrusion 212 is disposed further from the substrate 10 than the second lower surface 2112 of the body portion 211, such that the first protrusion 212 and the body portion 211 jointly define a groove 2120 facing the second protrusion 222, the first protrusion 212 and the second protrusion 222 are aligned along a vibration direction of the diaphragm 22. A projection of the first protrusion 212 along the vibration direction of the diaphragm 22 is located in the second protrusion 222 totally. A sacrificial layer 30 is provided between the diaphragm 22 and the back plate 21, the sacrificial layer 30 raises the distance between the diaphragm 22 and the substrate 21, thereby increasing the resonant frequency. In addition, a projection of the second protrusion 222 along the vibration direction of the diaphragm 22 is located in the upper end 111 of the substrate 10 totally, the sacrificial layer 30 is connected with an outer edge of the diaphragm 22 and the substrate 10, i.e., the raised sacrificial layer 30 reduces the damping between the diaphragm 22 and the substrate 10 when the airflow passes through the gap between the diaphragm 22 and the substrate 10.

The first protrusion 212 and the second protrusion 222 are annular structures, a MEMS microphone in other embodiments could include a plurality of the first projections and the second projections spaced apart from each other. The back plate 21 is provided with a plurality of through holes 210 communicating with the outside and the gap 201, the through holes 210 penetrate through the first protrusion 212. The diaphragm 22 is provided with a slit 220 penetrating through the second protrusion 222, the gap 201 is communicating with the back cavity 11 through the slit 220. The slit 220 can be used to adjust the damping of the diaphragm 22.

Compared with the related art, since the opening of the back cavity 11 at the upper end 111 of the substrate 10 is larger than the opening at the lower end 112 of the substrate 10, and the back plate 21 and the diaphragm 22 are provided with a first projection 212 and a second projection 222 respectively, thereby increasing the resonant frequency of the MEMS microphone 100.

The above descriptions are merely some of the embodiments of the present disclosure. It should be pointed out that for those of ordinary skill in the art, improvements can be made without departing from the inventive concept of the present disclosure, shall fall within the scope of the present disclosure.

What is claimed is:

1. A MEMS microphone, comprising:

a substrate with a back cavity, and a capacitive system located on the substrate, comprising a back plate and a diaphragm opposite to the back plate, a gap formed between the back plate and the diaphragm, wherein the back plate comprises a body portion and a first protrusion extending from the body portion in a direction away from the substrate, the diaphragm comprises a main portion and a second protrusion extending from the main portion in the direction away from the substrate, the first protrusion comprises a first upper surface away from the substrate and a first lower surface close to the substrate, the body portion comprises a second upper surface away from the substrate and a second lower surface close to the substrate, the first upper surface of the first protrusion is disposed further from the substrate than the second upper surface of the body portion, and the first lower surface of the first protrusion is disposed further from the substrate than the second lower surface of the body portion, such that the first protrusion and the body portion jointly define a groove facing the second protrusion, the first protrusion and the second protrusion are aligned along a vibration direction of the diaphragm, the substrate comprises an upper end close to the capacitive system and a lower end away from the capacitive system, an opening of the back cavity at the upper end of the substrate is larger than an opening at the lower end of the substrate.

2. The MEMS microphone described as claim 1, wherein the diaphragm is located at a side of the back plate close to the substrate.

3. The MEMS microphone described as claim 2, wherein the first protrusion and the second protrusion are annular structures.

4. The MEMS microphone described as claim 1, wherein the back plate is provided with a plurality of through holes communicating with the outside and the gap, the through holes penetrate through the first protrusion.

5. The MEMS microphone described as claim 1, wherein the diaphragm is provided with a slit penetrating through the second protrusion, the gap communicates with the back cavity through the slit.

6. The MEMS microphone described as claim 1, wherein an aperture diameter of the back cavity becomes progressively larger in a direction from the upper end of the substrate to the lower end of the substrate.

7. The MEMS microphone described as claim 1, wherein a projection of the second protrusion along the vibration direction of the diaphragm is located in the upper end of the substrate totally.

8. The MEMS microphone described as claim 1, wherein a sacrificial layer is provided between the diaphragm and the substrate, the sacrificial layer is connected with an outer edge of the diaphragm and the substrate.

9. The MEMS microphone described as claim 1, wherein a projection of the first protrusion along the vibration direction of the diaphragm is located in the second protrusion totally.

* * * * *